US010217515B2

(12) United States Patent
Goda et al.

(10) Patent No.: US 10,217,515 B2
(45) Date of Patent: Feb. 26, 2019

(54) PROGRAMMING MEMORY DEVICES

(71) Applicants: Akira Goda, Boise, ID (US); Tommaso Vali, Marine (IT); Carmine Miccoli, Boise, ID (US); Pranav Kalavade, San Jose, CA (US)

(72) Inventors: Akira Goda, Boise, ID (US); Tommaso Vali, Marine (IT); Carmine Miccoli, Boise, ID (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/477,048

(22) Filed: Apr. 1, 2017

(65) Prior Publication Data

US 2018/0286483 A1  Oct. 4, 2018

(51) Int. Cl.
| | | |
|---|---|---|
| *G11C 16/04* | (2006.01) | |
| *G11C 16/34* | (2006.01) | |
| *G11C 16/12* | (2006.01) | |
| *G11C 8/08* | (2006.01) | |

(52) U.S. Cl.
CPC ............ *G11C 16/0483* (2013.01); *G11C 8/08* (2013.01); *G11C 16/12* (2013.01); *G11C 16/3459* (2013.01)

(58) Field of Classification Search
CPC ............ G11C 16/3454; G11C 16/3459; G11C 11/5628
USPC .................................................... 365/185.22
See application file for complete search history.

(56) References Cited

U.S. PATENT DOCUMENTS

| | | | |
|---|---|---|---|
| 6,643,188 B2 | 11/2003 | Tanaka et al. | |
| 7,692,971 B2 | 4/2010 | Moschiano et al. | |
| 9,633,719 B2 | 4/2017 | Miccoli et al. | |
| 2002/0141237 A1 | 10/2002 | Goda et al. | |
| 2007/0171725 A1 | 7/2007 | Chan | |
| 2009/0010068 A1 | 1/2009 | Lee | |
| 2011/0058424 A1 | 3/2011 | Goda et al. | |
| 2011/0194352 A1 | 8/2011 | Zhao et al. | |
| 2012/0170364 A1 | 7/2012 | Jang et al. | |

(Continued)

OTHER PUBLICATIONS

Lee et al.; "A 64Gb 533Mb/s DDR Interface MLC NAND Flash in Sub-20nm Technology"; In: IEEE International Solid-State Circuits Conference Digest of Technical Papers (ISSCC); 2012 IEEE International; San Francisco, CA, USA; (Feb. 19-23, 2012); 3 pages; IEEE; <doi: 10.1109/ISSCC.2012.6177077 >.

(Continued)

*Primary Examiner* — Hoai V Ho
*Assistant Examiner* — Minh Dinh
(74) *Attorney, Agent, or Firm* — Thorpe North & Western, LLP; David W. Osborne

(57) ABSTRACT

Technology for a memory device operable to program memory cells in the memory device is described. The memory device can include a plurality of memory cells and a memory controller. The memory controller can perform a first programming pass to program a memory cell in the plurality of memory cells. A defined number of blanket programming pulses can be applied to the memory cell during the first programming pass. The blanket programming pulses may not include verify operations. The memory controller can perform a second programming pass to program the memory cell. A defined number of program and verify (PV) pulses can be applied to the memory cell during the second programming pass.

24 Claims, 10 Drawing Sheets

(56) References Cited

U.S. PATENT DOCUMENTS

2013/0028018 A1   1/2013   Cho et al.
2013/0258781 A1   10/2013  Goda et al.
2014/0247657 A1   9/2014   Jang et al.
2016/0351253 A1*  12/2016  Miccoli .............. G11C 11/5628
2017/0178737 A1   6/2017   Miccoli et al.

OTHER PUBLICATIONS

Miccoli et al.; "Investigation of the Programming Accuracy of a Double-Verify ISPP Algorithm for Nanoscale NAND Flash Memories"; In: IEEE International Reliability Physics Symposium (IRPS); 2011 IEEE International; Monterey, CA, USA; (Apr. 10-14, 2011); pp. 833-838; IEEE; <doi: 10.1109/IRPS.2011.5784588 >.
Naso et al.; "N-series NAND architecture"; Micron-TLP Technical Journal; (Apr. 2013); pp. 134-140; vol. 4, No. 1.; Micron Technology, Inc.

* cited by examiner

| Algorithm | 8-16 | 16-16 | 1-Pass | 16 Blanket + 16 PV | 16 Blanket + 16 PV with Prologue |
|---|---|---|---|---|---|
| 1st/2nd Pass Gate Steps* | 0.5V / 0.25V | 0.4V / 0.35V | 0.15V | 0.36V / 0.2V | 0.36V / 0.25V |
| State Width | 55 mV/sigma | 55 mV/sigma | 120 mV/sigma | 55 mV/sigma | 55 mV/sigma |
| Number of Program Pulses | 40 | 35 | 45 | 47 | 44 |

(*): Program Slope = 1

FIG. 2

| 8-16 | | | | |
|---|---|---|---|---|
| QLC | 8 | | 16 | |
| | Time (us) | Number | Time (us) | Number |
| Overhead (once) | 57 | 1 | 160 | 1 |
| Per Pulse | 66 | 19.6 | 66 | 43.7 |
| Per SSPC Verify | 25 | 0 | 25 | 0 |
| Per Non-SSPC Verify | 25 | 64 | 25 | 206 |
| Total PGM Pulse Time | | 1351 | | 3044 |
| Total VRFY Time | | 1600 | | 5150 |
| TPROG | | 2951 | | 8194 |
| Effective (per bit) | 2786 | | | |

| 16-NOVFY-16 (10 us added to active pulse of 10us) | | | | |
|---|---|---|---|---|
| QLC | 16NOVFY | | 16 | |
| | Time (us) | Number | Time (us) | Number |
| Overhead (once) | 57 | 1 | 160 | 1 |
| Per Pulse | 76 | 16 | 66 | 43.7 |
| Per SSPC Verify | 25 | 0 | 25 | 0 |
| Per Non-SSPC Verify | 25 | 0 | 25 | 206 |
| Total PGM Pulse Time | | 1273 | | 3044 |
| Total VRFY Time | | 0 | | 5150 |
| TPROG | | 1273 | | 8194 |
| Effective (per bit) | 2367 | | | |

PROGRAMMING MEMORY DEVICES

BACKGROUND

Memory devices are typically provided as internal, semiconductor, integrated circuits in computers or other electronic devices. There are many different types of memory including volatile memory, for example, dynamic random access memory (DRAM) and synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein:

FIG. 2 is a table illustrating various techniques for programming memory devices in accordance with an example embodiment;

Figure 1:
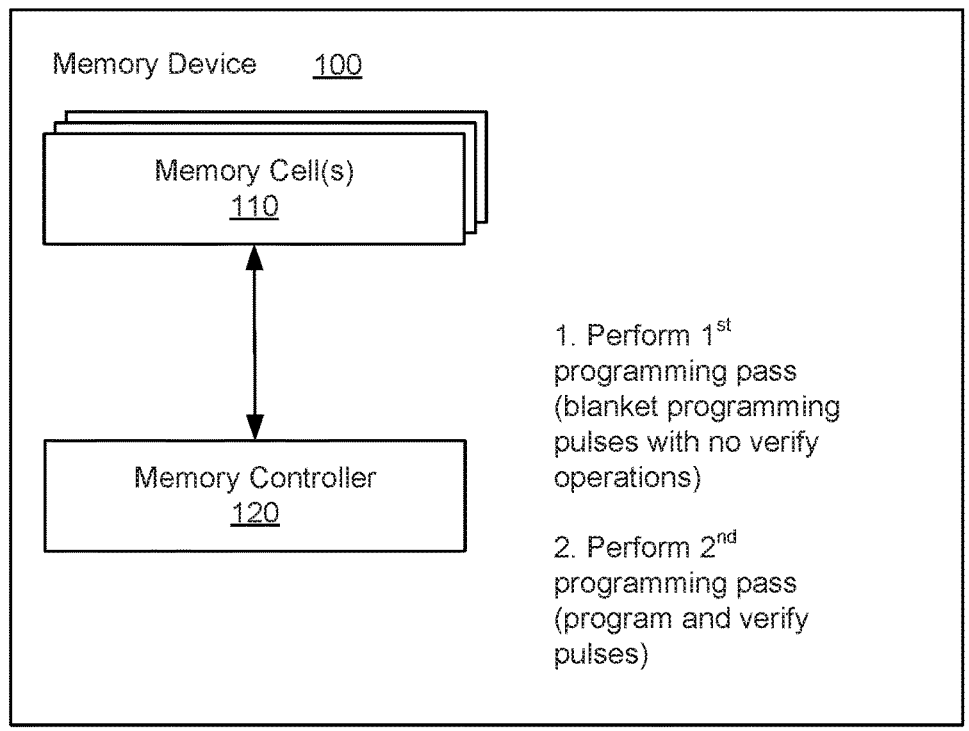
FIG. 1 illustrates a memory device operable to program memory cells in the memory device in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

A multi-bit flash memory device, such as a quad-level cell (QLC) (i.e., 4 bits per cell) flash NAND memory device, can be programmed using one or more programming passes (e.g., 2-programming passes). For example, in a typical QLC flash NAND memory device, the 16 levels (e.g., 4 bits of data) can be programmed using one or multiple programming passes, and Program and Verify (PV) Incremental Step Pulse Programming (ISPP) can be employed in each of the one or multiple programming passes. However, in some cases, single pass programming may not be implementable due to technological/process limitations, for example, due to large floating gate-floating gate (FG-FG) coupling. Single pass programming may not be implementable unless small FG-FG coupling and a wide program/erase (P/E) window is provided. In addition, the usage of multiple programming passes can result in increased programming time (tProg) due to a relatively large number of program pulses and verify operations during a first programming pass (especially when 8 or 16 levels are placed during the first programming pass).

Therefore, in the present technology, a multi-bit flash memory device, such as a QLC flash NAND memory device, can be programmed using a two-pass programming procedure. In contrast to the previous solutions that utilize a first PV ISPP programming pass, the present technology can utilize a first programming pass with N blanket pulses programming, wherein N corresponds to a number of levels for the multi-bit flash memory device (e.g., N can correspond to 16 levels for QLC). In other words, the first programming pass with N blanket pulses programming can replace the first PV ISPP programming pass. A "blanket pulse" can refer to a programming pulse that does not include a verify operation. During the first programming pass, at least N blanket ISPP pulses (which excludes verify operations) can be applied to place N intermediate coarse states. In some cases, instead of blanket ISPP pulses, similar types of blanket programming pulses can be used. The N blanket ISPP pulses can be a sequence of incremental blanket pulses with no verify operations between the incremental blanket pulses. During a second programming pass, N PV ISPP pulses (which includes the verify operations) can be applied to the N intermediate coarse states. The application of the first programming pass and the second programming pass (in this order) can function to program cells in the multi-bit flash memory device.

By removing the verify operations in the first programming pass, the second programming pass can take benefit from reduced proximity effect resulting in improved accuracy. Programming time savings can be achieved due to a reduced number of programming pulses during the first programming pass and the removal of verify operations in the first programming pass. In addition, the usage of the first programming pass with no verify operations can provide additional flexibility in order to achieve enhanced operations which balance placement accuracy and performance.

For the example of the QLC flash NAND memory device, the two-pass programming procedure can involve applying 16 blanket pulses in a first programming pass and applying 16 PV ISPP pulses in a second programming pass. In this example, N can be equal to 16 since there are 16 levels for QLC.

When single-pass programming is utilized in the multi-bit flash memory device, all cells in a page can be programmed directly from an erased state to a final programmed level in a single programming pass. While single-pass programming is capable of providing a fastest effective programming time, as compared to using multiple passes of programming, single-pass programming may not achieve a desired programming accuracy in certain cases. For example, programming accuracy when using single-pass programming can degrade due to page-to-page disturbs, such as FG-FG coupling, as well as other mechanisms degrading a state width, such as a lack of proximity effect. Therefore, in some cases, rather than using single-pass programming, multi-pass programming can be employed to program cells in the multi-bit flash memory device. The usage of multi-pass programming can resolve the deficiencies associated with single-pass programming.

In one example, the multi-pass programming can be 2-pass programming. In 2-pass programming, 2, 4, 8 or 16 intermediate states can be placed in a first programming pass before programming a final 16 states in a second programming pass. In this example, the multi-bit flash memory device can utilize QLC, and a programming time penalty can depend on a number of intermediate states placed in the first programming pass.

In one example, an improved balance between programming accuracy and programming time can be achieved when single pass programming mechanisms cannot achieve a desired placement accuracy (e.g., due to disturbs or other state-width degradation mechanisms), and two-pass programming mechanisms introduce an increased programming time penalty (e.g., due to a high number of verify operations in a first programming pass). Such a programming time penalty can be significant for a traditional 16-16 QLC programming mechanism (i.e., 16 program pulses in a first pass and 16 program pulses in a second pass, and both passes include verify operations) or a traditional 8-16 QLC programming mechanism (i.e., 8 program pulses in a first pass and 16 program pulses in a second pass, and both passes include verify operations).

Therefore, a (Blanket 16)+(PV 16) QLC programming mechanism (i.e., 16 blanket pulses without verify operations in a first pass and 16 program pulses with verify operations in a second pass) can achieve improved placement accuracy due to the first programming pass (on 16 intermediate levels) with a minimal burden on the programming time. The improved placement accuracy and reduced programming time can be achieved due to (1) a reduced number of programming pulses (e.g., one pulse for each programmed level in addition to a certain number of pulses when a 'prologue phase' is desired), and (2) a reduced number of verify operations (e.g., no verifies in the first pass when all of the pulses are blanket and the 'prologue phase' is skipped).

In traditional methods, a first pass with coarse programming (e.g., less than or equal to 16 states for QLC) can include a verify at a wordline (WLn)+1, and a second pass with fine programming (e.g., 16 states for QLC) can include a verify at the WLn. In contrast, in the present technology, a first pass with coarse programming (e.g., less than or equal to 16 states for QLC) can exclude a verify at the WLn, and a second pass with fine programming (e.g., 16 states for QLC) can include a verify at the WLn.

FIG. 1 illustrates an exemplary memory device 100 operable to program memory cells 110 in the memory device 100 via a memory controller 120. In one example, the memory device 100 can utilize non-volatile memory. Non-volatile memory is a storage medium that does not require power to maintain the state of data stored by the medium. Non-limiting examples of non-volatile memory can include any or a combination of solid state memory (such as planar or three-dimensional (3D) NAND flash memory, NOR flash memory, or the like), cross point array memory, including 3D cross point memory, phase change memory (PCM), such as chalcogenide PCM, non-volatile dual in-line memory module (NVDIMM), byte addressable nonvolatile memory, ferroelectric memory (FeRAIVI), silicon-oxide-nitride-oxide-silicon (SONOS) memory, polymer memory (e.g., ferroelectric polymer memory), ferroelectric transistor random access memory (Fe-TRAM), spin transfer torque (STT) memory, nanowire memory, electrically erasable programmable read-only memory (EEPROM), magnetic storage memory, magnetoresistive random-access memory (MRAM), write in place non-volatile MRAM (NVMRAM), nanotube RAM (NRAM), and the like. In some examples, non-volatile memory can comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In one specific example, the memory device 100 can utilize 3D cross point memory. In another specific example, the system memory can be STT memory.

In one example, the memory device 100 can be a NAND flash memory device. The memory cells 110 can be multi-bit or multi-level cells (MLC). For example, the memory cells 110 can be quad-level cells (QLC) with 4 bits per cell. Alternatively, the memory cells 110 can be tri-level cells (TLC) with 3 bits per cell or single-level cells (SLC) with 1 bit per cell. In short, many different levels of bits per cell can be used.

In one example, the memory cells 110 can be programmed using the memory controller 120 in the memory device 100. For example, the memory controller 120 can perform a first programming pass to program a defined number of levels in a memory cell 110 in the memory device 100. More specifically, the memory controller 120 can apply a defined number of incremental step pulse programming (ISPP) blanket programming pulses to the defined number of levels in the memory cell 110 during the first programming pass. The memory controller 120 can apply the defined number of ISPP blanket programming pulses to the defined number of levels in the memory cell 110 in order to transform the defined number of levels in the memory cell 110 into a defined number of intermediate coarse levels in the memory cell 110.

In one example, the defined number of levels in the memory cell 110 can depend on a number of bits in the memory cell 110. For example, the defined number of levels can be 16 when the memory cell 110 utilizes QLC, the defined number of levels can be 8 when the memory cell 100 utilizes TLC, or the defined number of levels can be 2 when the memory cell 100 utilizes SLC. Similarly, the defined number of ISPP blanket programming pulses can depend on the number of bits in the memory cell 110, and the defined number of ISPP blanket programming pulses can correspond to the defined number of levels in the memory cell 110. Therefore, the defined number of ISPP blanket programming pulses applied during the first programming pass can be 16 when the memory cell 110 utilizes QLC, 8 when the memory cell 100 utilizes TLC, or 2 when the memory cell 100 utilizes SLC.

In one example, the defined number of ISPP blanket programming pulses applied during the first programming pass may not include verify operations. In other words, verify operations can be skipped between each of the ISPP blanket programming pulses applied during the first programming pass. In one example, the first programming pass can be performed without the verify operations (e.g., in order to reduce a programming time when programming the memory cell 110).

In one example, the memory controller 120 can perform a second programming pass to program the defined number of intermediate coarse levels in the memory cell 110 after completion of the first programming pass. More specifically, the memory controller 120 can apply a defined number of program and verify (PV) ISPP pulses to the defined number of intermediate coarse levels in the memory cell 110 during the second programming pass. As explained above, the defined number of intermediate coarse levels in the memory cell 110 can result after the first programming pass. Unlike the ISPP blanket programming pulses applied in the first programming pass, the PV ISPP pulses applied in the second programming pass can include verify operations. Therefore, the memory controller 120 can apply the ISPP blanket programming pulses in the first programming pass and the PV ISPP pulses in the second programming pass (in this order) in order to program memory cells 110 in the memory device 100.

In one example, the defined number of PV ISPP pulses can depend on the number of bits in the memory cell 110, and the defined number of PV ISPP pulses can correspond to the defined number of levels and the defined number of ISPP blanket programming pulses. Therefore, the defined number of PV ISPP pulses applied during the second programming pass can be 16 when the memory cell 110 utilizes QLC, 8 when the memory cell 100 utilizes TLC, or 2 when the memory cell 100 utilizes SLC.

As a non-limiting example, when the memory cells 110 utilize QLC, the memory controller 120 can apply N ISPP blanket programming pulses to N levels in the memory cell 110 during a first programming pass, wherein N is equal to 16 (e.g., 16 levels for QLC). In addition, the memory controller 120 can apply N PV ISPP pulses to the N levels in the memory cell 110 during a second programming pass. Therefore, in this example, the memory controller 120 can apply 16 ISPP blanket programming pulses (without verify operations) to the 16 levels during the first programming pass and 16 PV ISPP pulses to the 16 levels during the second programming pass in order to program the memory cell 110.

In one example, the memory controller 120 can perform a prologue programming pass prior to the first programming pass to achieve a stationary programming condition. After the completion of the prologue programming pass to achieve the stationary programming condition, the memory controller 120 can perform the first and second programming passes, as described above.

In one configuration, cells to be programmed on a first final state (L1) can be inhibited after M blanket pulses, wherein M is an integer. Cells to be programmed on a second final state (L2) can be inhibited after M+1 blanket pulses, and so on. Here, cells to be programmed on a Nth final state (Ln) can be inhibited after M+N−1 blanket pulses, wherein N is an integer. In one example, M can be set to 1. When a prologue phase in inserted, as described below, M can be set to a value other than 1. An amplitude of an M blanket pulse can be a start wordline (WL) voltage, and the following N−1 blanket pulses in a first programming pass can have an incremental increasing amplitude. As a result, N coarse levels can be placed upon completion of the first programming pass (with the blanket pulses). The first programming pass can have a relatively fast programming time given by M+N−1 program pulses with no time spent for verify operations. During a second programming pass, a final N states can be programmed starting from corresponding N coarse levels (or intermediate blanket levels), which can allow for improved placement due to proximity effect and FG-FG reduction (e.g., when a back-and-forth page programming sequence is used). Unlike the first programming pass (with the blanket pulses), the second programming pass can include verify operations. In one example, data cannot be read after the first programming pass (with the blanket pulses), and therefore, a controller can store and provide all pages of data both during the first and second programming passes.

In one configuration, the novel (Blanket 16)+(PV 16) QLC programming mechanism can be modified to include a single verify for each programming pulse. For example, rather than programming cells on Nth levels to be inhibited after M+N−1 blanket pulses, an Nth level can be verified after a corresponding blanket pulse and then only cells above a given PV level can be selectively inhibited during a following blanket pulse. In this way, coarse placement can be improved (i.e., it is not completely blanket) at the expense of one verify operation for each blanket pulse.

In another configuration, the (Blanket 16)+(PV 16) QLC programming mechanism can be modified to include a programming prologue phase to improve placement of the 16 blanket pulses. For example, a first programming pass can be modified with an insertion of the programming prologue phase. The programming prologue phase can be useful for achieving a stationary programming condition (e.g., with a program slope of 1), which can allow for a more predictable placement with the blanket pulses. A word line start voltage (WLSV) can be set low enough to provide a level of guard-band and avoid overshoot. During the programming prologue phase, Incremental Program and Verify pulses can be applied to verify the cells (e.g., until the fastest cells reach a predetermined level). Thus, the programming prologue phase can add an overhead to the programming time (e.g., time for additional pulses and additional verifies). However, the insertion of the programming prologue phase can be beneficial for setting an initial state for a second phase (i.e., blanket pulses programming) with precision and achieving the program slope equal to 1. After completion of the programming prologue phase, blanket pulses can be applied as described above (e.g., 0 pulses for L1, 1 pulse for L2, 2 pulses for L3, 14 pulses for L15).

In one example, a programming pulse duration can differ between the programming prologue phase, the first programming pass (with the blanket pulses), and the second programming pass (with the verify operations).

In one configuration, the novel (Blanket 16)+(PV 16) QLC programming mechanism can be modified to include both the single verify for each programming pulse and the programming prologue phase.

FIG. 2 is an exemplary table illustrating various techniques for programming memory devices. For a 8-16 programming mechanism (i.e., 8 program pulses (with verifies) in a first pass and 16 program pulses (with verifies) in a second pass), a first/second pass gate steps (with a program slope of 1) can be 0.5V/0.25V, a state width can be 55 mV/sigma and a number of program pulses can be 40. For a 16-16 programming mechanism (i.e., 16 program pulses (with verifies) in a first pass and 16 program pulses (with verifies) in a second pass), a first/second pass gate steps (with a program slope of 1) can be 0.4V/0.35V, a state width can be 55 mV/sigma and a number of program pulses can be 35. For a one-pass programming mechanism (i.e., all program pulses are applied in a single pass with verifies), a single pass gate step (with a program slope of 1) can be 0.15V, a state width can be 120 mV/sigma and a number of program pulses can be 45. For a 16 blanket and 16 PV programming mechanism (i.e., 16 program pulses in a first pass with no verify and 16 program pulses in a second pass with verifies), a first/second pass gate steps (with a program slope of 1) can be 0.36V/0.2V, a state width can be 55 mV/sigma and a number of program pulses can be 47. For a 16 blanket and 16 PV programming (with prologue) mechanism (i.e., a programming prologue phase, 16 program pulses in a first pass with no verify, and 16 program pulses in a second pass with verifies), a first/second pass gate steps (with a program slope of 1) can be 0.36V/0.25V, a state width can be 55 mV/sigma and a number of program pulses can be 44.

In one example, a first pass wordline start voltage can be optimized for the 16 blanket and 16 PV programming mechanism (with no guard-band) in order to obtain an optimal performance. However, when the first pass wordline voltage is decreased, a placement accuracy can degrade quickly. On the other hand, the 16 blanket and 16 PV programming (with prologue) mechanism can achieve improved performance, even if a wordline start voltage guard-band is set. In addition, the 16 blanket and 16 PV programming mechanism can utilize a same or an increased number of programming pulses, but programming time savings can be achieved due to a reduction in the number of verify operations.

Figure 3:
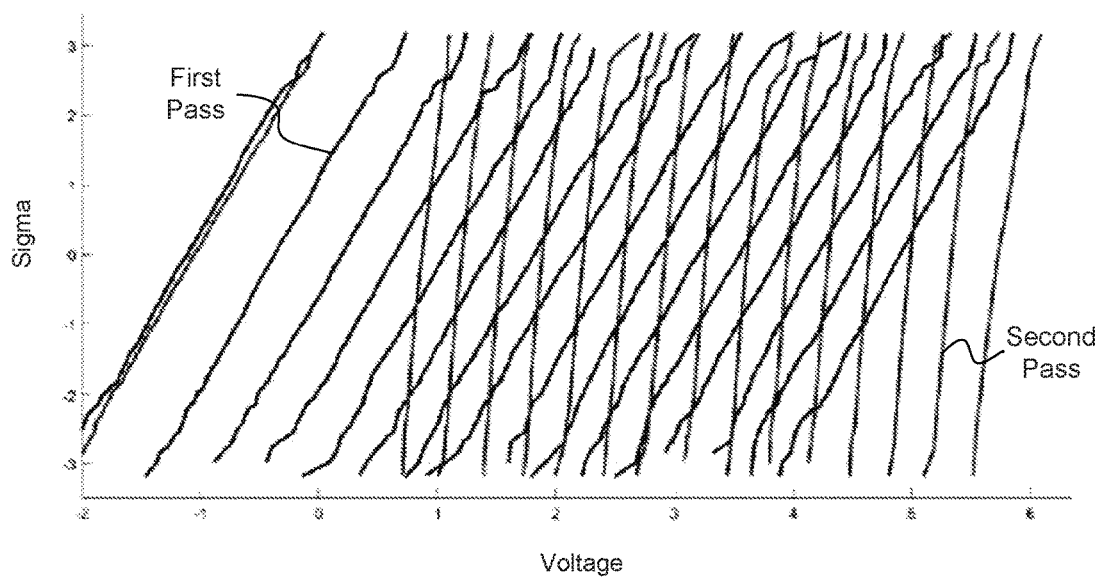
FIG. 3 illustrates a plurality of blanket pulses and a plurality of program verify (PV) pulses in accordance with an example embodiment.

FIG. 3 illustrates an example of a plurality of blanket pulses and a plurality of program verify (PV) pulses. In this example, 16 blanket pulses can be applied during a first programming pass in order to obtain 16 coarse levels. A gate step can be equal to a spacing between PVs. Due to an initial non-equilibrium/overshoot, a Delta Voltage (Vt) may not be constant. As a result, low levels can have a corresponding intermediate blanket state placed much lower than a final PV in order to avoid overshoot. In addition, 16 PV pulses can be applied during a second programming pass to obtain a final placement.

Figure 4:
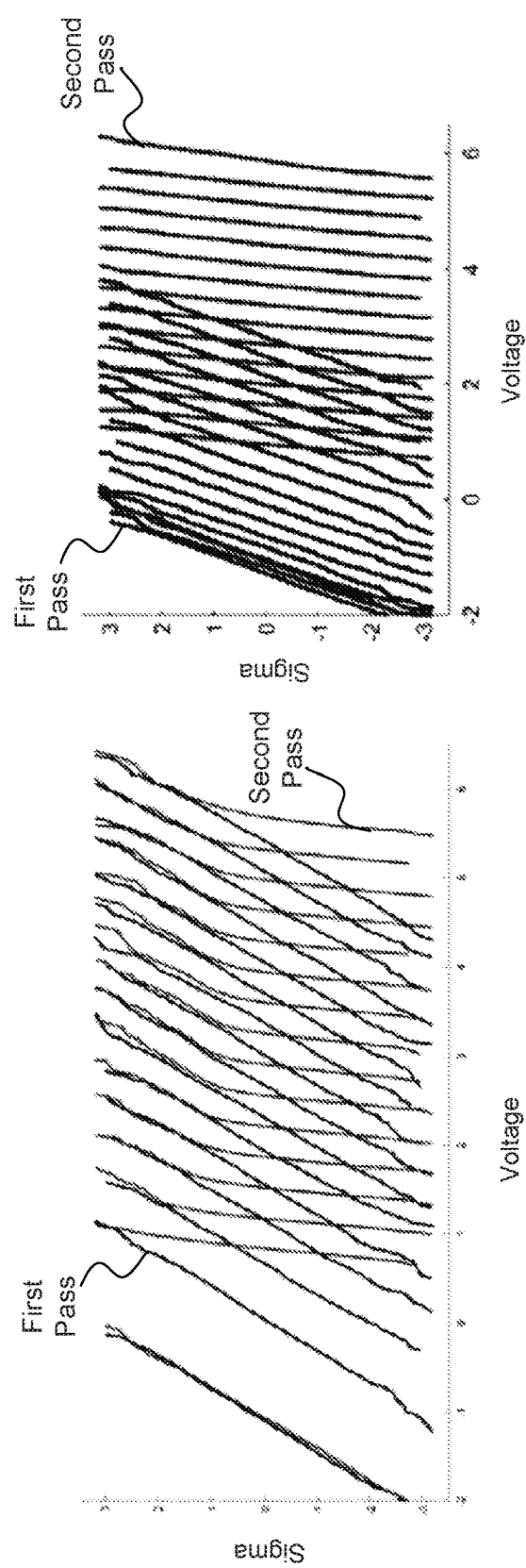
FIG. 4 illustrates a sensitivity to voltage variations in accordance with an example embodiment.

FIG. 4 illustrates an example of a sensitivity to voltage variations. More specifically, the sensitivity can be to VgVt/WLSV variations, where VgVt is a word line voltage minus a threshold voltage and WLSV represents a wordline start voltage. Blanket pulses placement can be sensitive to any variation of the VgVt and/or the WLSV. For example, as shown on the left side, a VgVt decrease of 0.5 volts (V) can result in a severe offshoot. As shown on the right, a 2V decrease of the wordline start voltage (e.g., as a guard-band) can result in a coarse placement being ineffective. As a result, it can be difficult to ensure a proper behavior of a 16 blanket and 16 PV programming mechanism under all possible conditions.

Figure 5:
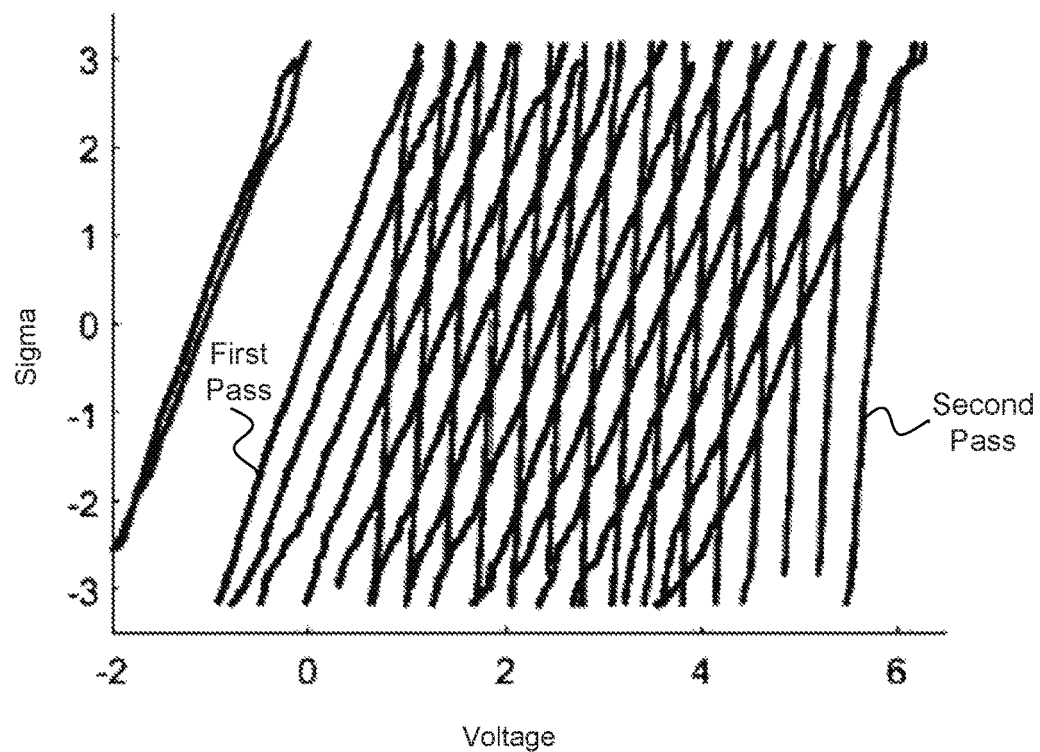
FIG. 5 illustrates a plurality of blanket pulses and a plurality of program verify (PV) pulses in a programming mechanism without a programming prologue phase in accordance with an example embodiment.

FIG. 5 illustrates an example of a plurality of blanket pulses and a plurality of program verify (PV) pulses in a programming mechanism without a programming prologue phase. In other words, the programming mechanism can be a 16 blanket and 16 PV programming mechanism, which can involve program pulses in a first pass with no verify and 16 program pulses in a second pass, and the programming mechanism may not include the programming prologue phase. In this example, 16 blanket pulses can be applied during a first programming pass in order to obtain 16 coarse levels. In addition, 16 PV pulses can be applied during a second programming pass to obtain a final placement.

Figure 6:
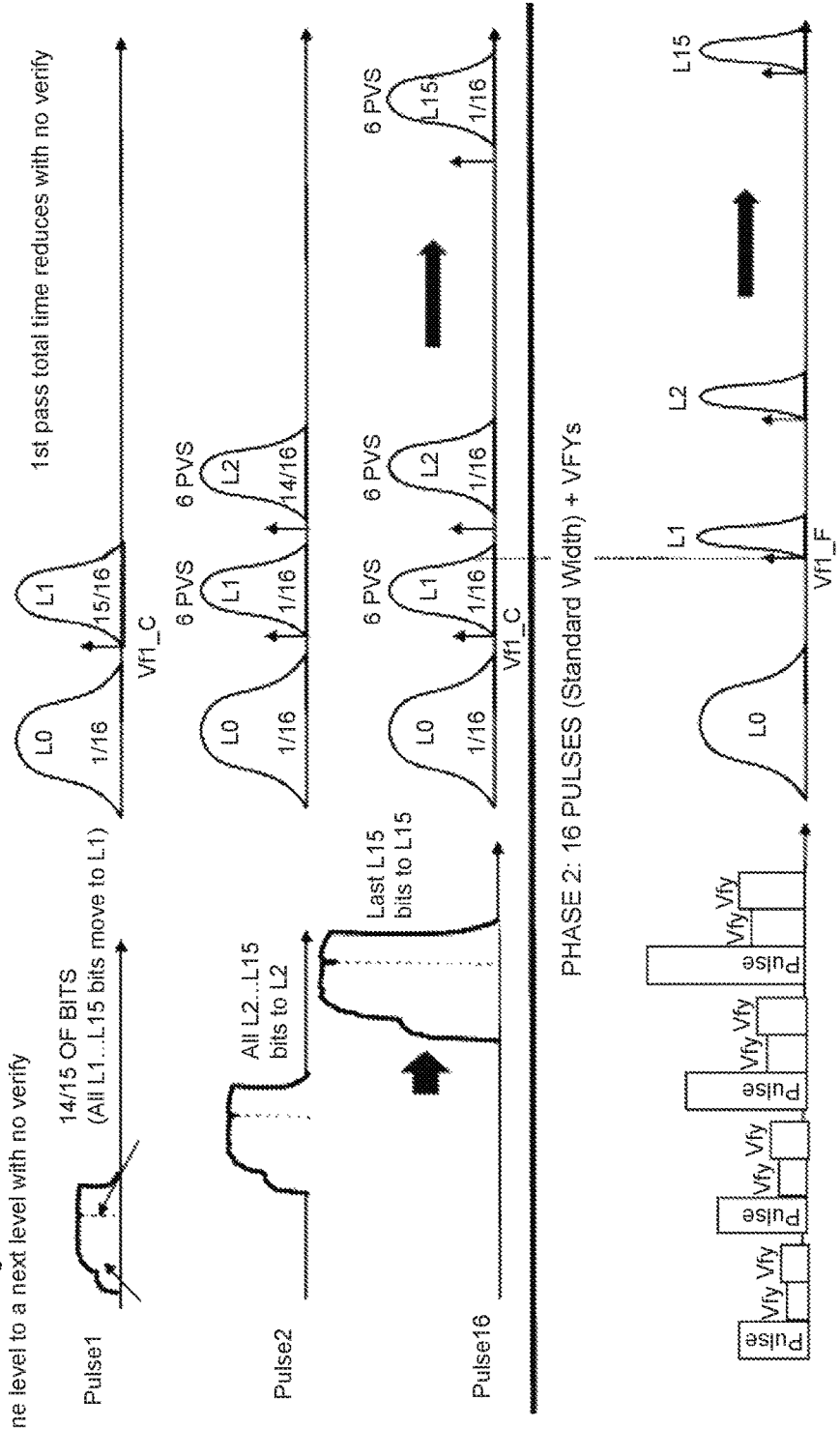
FIG. 6 illustrates a two-phase programming mechanism in accordance with an example embodiment.

FIG. 6 illustrates an exemplary two-phase programming mechanism. A first phase of the two-phase programming mechanism can involve 16 blanket pulses with no verify operations. Cells to be programmed on a first final state (L1) can be inhibited after M blanket programming pulses, cells to be programmed on a second final state (L2) can be inhibited after M+1 blanket programming pulses, and so on, such that cells to be programmed on a Nth final state (Ln) can be inhibited after M+N−1 blanket programming pulses, wherein M and N are integers. Furthermore, a second phase of the two-phase programming mechanism can involve 16 program and verify (PV) pulses (with a standard width). Based on the two-phase programming mechanism, cells in a memory device can be programmed.

Figure 7:
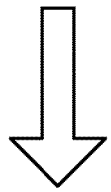
FIG. 7 is two tables illustrating a difference in programming time between two programming mechanisms in accordance with an example embodiment.

FIG. 7 is an example of two tables illustrating a difference in programming time between two programming mechanisms. In this example, for a 8-16 programming mechanism (i.e., 8 program pulses in a first pass and 16 program pulses in a second pass, and both passes include verify operations), the programming time can be 2951 microseconds (us). In contrast, for a 16 blanket and 16 PV programming mechanism (i.e., 16 program pulses in a first pass with no verify and 16 program pulses in a second pass), the programming time can be 1273 us. Therefore, the application of blanket pulses in a programming mechanism can function to reduce the programming time.

Figure 8:
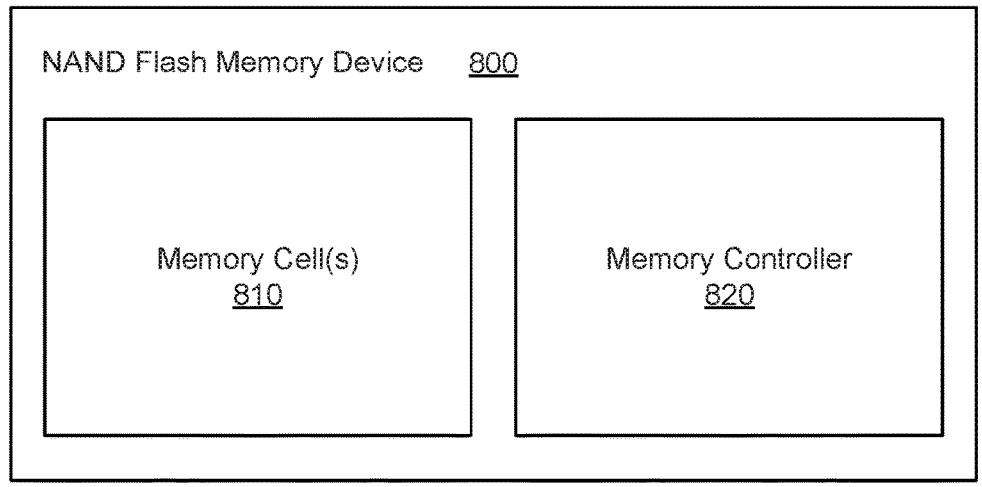
FIG. 8 illustrates a NAND flash memory device that includes memory cell(s) and a memory controller in accordance with an example embodiment.

FIG. 8 illustrates an exemplary NAND flash memory device 800 operable to program a plurality of memory cells 810 in the NAND memory device 800. The NAND flash memory device 800 can include the plurality of memory cells 810 and a memory controller 820. The memory controller 820 can perform a first programming pass to program a defined number of levels in a memory cell in the plurality of memory cells 810. A defined number of blanket programming pulses can be applied to the defined number of levels in the memory cell during the first programming pass. The blanket programming pulses may not include verify operations. The memory controller 820 can perform a second programming pass to program the defined number of levels in the memory cell after completion of the first programming pass. A defined number of program and verify (PV) pulses can be applied to the defined number of levels in the memory cell during the second programming pass.

Figure 9:
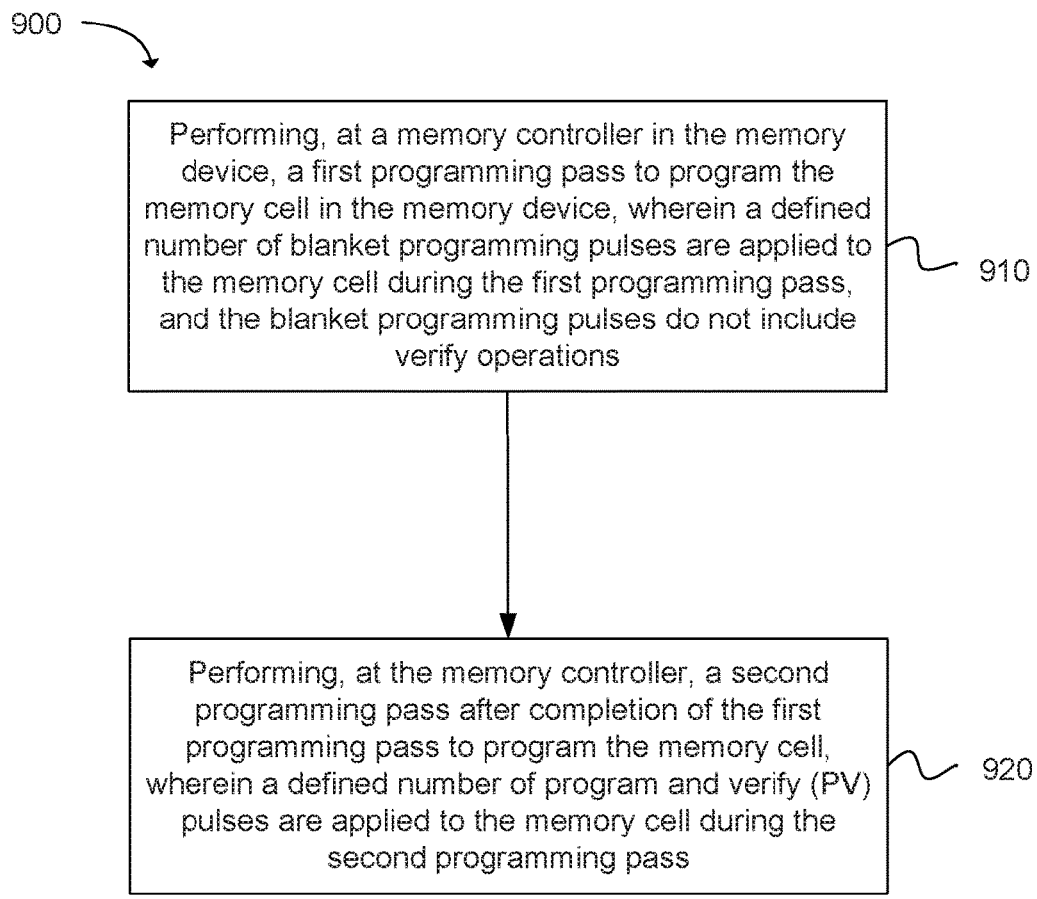
FIG. 9 depicts a flowchart of a method for programming a memory cell in a memory device in accordance with an example embodiment.

Another example provides a method 900 for programming a memory cell in a memory device, as shown in the flow chart in FIG. 9. The method can be executed as instructions on a machine, where the instructions are included on at least one computer readable medium or at least one non-transitory machine readable storage medium. The method can include the operation of: performing, at a memory controller in the memory device, a first programming pass to program the memory cell in the memory device, wherein a defined number of blanket programming pulses are applied to the memory cell during the first programming pass, and the blanket programming pulses do not include, lack, exclude, or otherwise omit verify operations, as in block 910. The method can include the operation of: performing, at the memory controller, a second programming pass after completion of the first programming pass to program the memory cell, wherein a defined number of program and verify (PV) pulses are applied to the memory cell during the second programming pass, as in block 920.

Figure 10:
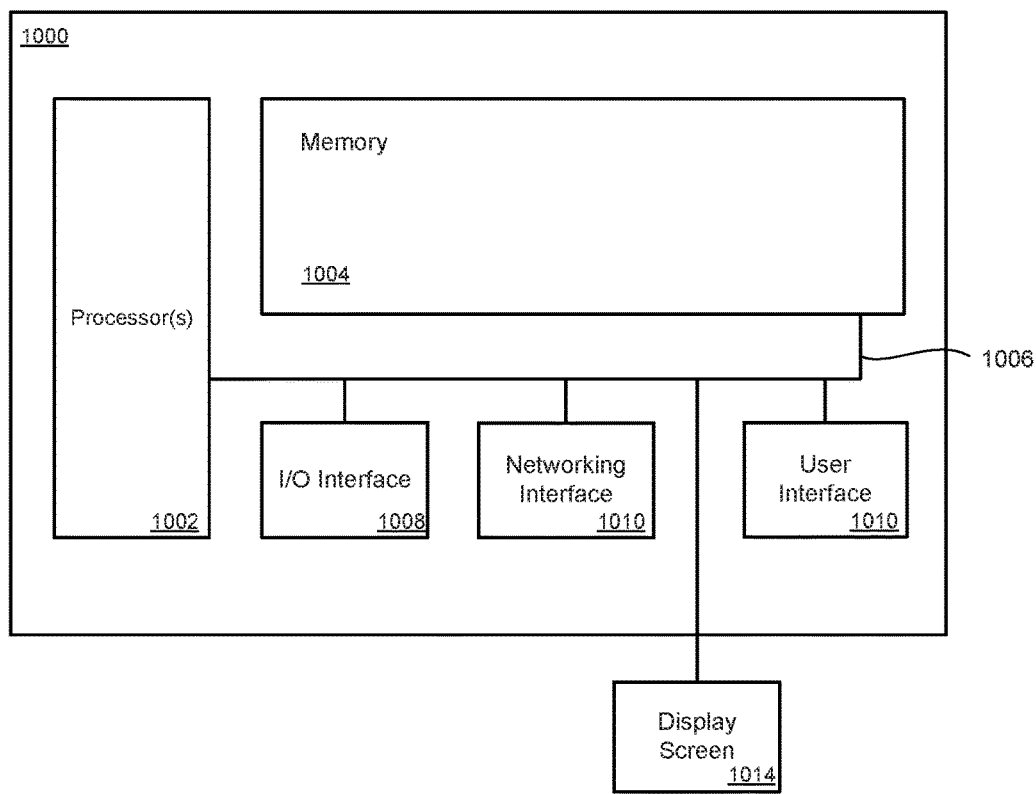
FIG. 10 illustrates a computing system that includes a data storage device in accordance with an example embodiment.

FIG. 10 illustrates a general computing system or device 1000 that can be employed in the present technology. The computing system 1000 can include a processor 1002 in communication with a memory 1004. The memory 1004 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1000 additionally includes a local communication interface 1006 for connectivity between the various components of the system. For example, the local communication interface 1006 can be a local data bus and/or any related address or control busses as may be desired.

The computing system or device 1000 can also include an I/O (input/output) interface 1008 for controlling the I/O functions of the system, as well as for I/O connectivity to devices outside of the computing system 1000. A network interface 1010 can also be included for network connectivity. The network interface 1010 can control network communications both within the system and outside of the system. The network interface can include a wired interface, a wireless interface, a Bluetooth interface, optical interface, and the like, including appropriate combinations thereof. Furthermore, the computing system 1000 can additionally include a user interface 1012, a display device 1014, as well as various other components that would be beneficial for such a system.

The processor 1002 can be a single or multiple processors, and the memory 1004 can be a single or multiple memories.

The local communication interface 1006 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided a memory device operable to program memory cells in the memory device, the memory device comprising:
  a plurality of memory cells; and
  a memory controller comprising logic to:
    perform a first programming pass to program a memory cell in the plurality of memory cells, wherein a defined number of blanket programming pulses are applied to the memory cell during the first programming pass, and the blanket programming pulses do not include verify operations; and
    perform a second programming pass to program the memory cell, wherein a defined number of program and verify (PV) pulses are applied to the memory cell during the second programming pass.

In one example of the memory device:
the logic to perform the first programming pass is to apply the defined number of blanket programming pulses to transform a defined number of levels in the memory cell into a defined number of intermediate coarse levels in the memory cell; and
the logic to perform the second programming pass is to apply the defined number of PV pulses to the defined number of intermediate coarse levels in the memory cell.

In one example of the memory device:
the first programming pass includes a defined number of incremental step pulse programming (ISPP) blanket programming pulses without the verify operations; and
the second programming pass includes a defined number of PV ISPP programming pulses.

In one example of the memory device, the memory controller further comprises logic to perform a two-pass programming procedure that includes the first programming pass and the second programming pass, wherein the first programming pass excludes verify operations and the second programming pass includes verify operations.

In one example of the memory device, the memory controller further comprises logic to perform a prologue programming pass prior to the first programming pass to achieve a stationary programming condition.

In one example of the memory device, the memory controller further comprises logic to perform the first programming pass without the verify operations to reduce a programming time for programming the memory cell.

In one example of the memory device, the defined number of blanket programming pulses and the defined number of PV pulses depend on a number of bits in the memory cell.

In one example of the memory device, the plurality of memory cells are multi-bit cells.

In one example of the memory device, the plurality of memory cells are quad-level cells (QLC) with 4 bits per cell.

In one example of the memory device, the memory device is a NAND flash memory device.

In one example there is provided a NAND flash memory device operable to program memory cells in the NAND memory device, the NAND memory device comprising:
a plurality of memory cells; and
a memory controller comprising logic to:
perform a first programming pass to program a defined number of levels in a memory cell in the plurality of memory cells, wherein a defined number of blanket programming pulses are to be applied to the defined number of levels in the memory cell during the first programming pass, and the blanket programming pulses do not include verify operations; and
perform a second programming pass to program the defined number of levels in the memory cell after completion of the first programming pass, wherein a defined number of program and verify (PV) pulses are to be applied to the defined number of levels in the memory cell during the second programming pass.

In one example of the NAND flash memory device:
the logic to perform the first programming pass is to transform the defined number of levels in the memory cell into a defined number of intermediate coarse levels in the memory cell; and
the logic to perform the second programming pass is to apply the defined number of PV pulses to the defined number of intermediate coarse levels in the memory cell.

In one example of the NAND flash memory device:
the first programming pass includes a defined number incremental step pulse programming (ISPP) blanket programming pulses without the verify operations; and
the second programming pass includes a defined number of PV ISPP programming pulses.

In one example of the NAND flash memory device, the memory controller further comprises logic to perform a two-pass programming mechanism that includes the first programming pass and the second programming pass, wherein the first programming pass excludes verify operations and the second programming pass includes verify operations.

In one example of the NAND flash memory device, the memory controller further comprises logic to perform a prologue programming pass prior to the first programming pass to achieve a stationary programming condition.

In one example of the NAND flash memory device, the memory controller further comprises logic to perform the first programming pass without the verify operations to reduce a programming time for programming the memory cell.

In one example of the NAND flash memory device, the defined number of levels in the memory cell depends on a number of bits in the memory cell, and the defined number of blanket programming pulses and the defined number of PV pulses correspond to the defined number of levels.

In one example of the NAND flash memory device, the plurality of memory cells are multi-bit cells.

In one example of the NAND flash memory device, the plurality of memory cells are quad-level cells (QLC) with 4 bits per cell.

In one example there is provided a system operable to program memory cells in the memory device, the system comprising:
a plurality of memory cells; and
a memory controller comprising logic to:
perform a first programming pass to program a memory cell in the plurality of memory cells, wherein a defined number of blanket programming pulses are applied to the memory cell during the first programming pass, and the blanket programming pulses do not include verify operations; and
perform a second programming pass to program the memory cell, wherein a defined number of program and verify (PV) pulses are applied to the memory cell during the second programming pass.

In one example of the system:
the logic to perform the first programming pass is to apply the defined number of blanket programming pulses to transform a defined number of levels in the memory cell into a defined number of intermediate coarse levels in the memory cell; and
the logic to perform the second programming pass is to apply the defined number of PV pulses to the defined number of intermediate coarse levels in the memory cell.

In one example of the system:
the first programming pass includes a defined number of incremental step pulse programming (ISPP) blanket programming pulses without the verify operations; and
the second programming pass includes a defined number of PV ISPP programming pulses.

In one example there is provided a method for programming a memory cell in a memory device, comprising:
performing, at a memory controller in the memory device, a first programming pass to program the memory cell in the memory device, wherein a defined number of blanket programming pulses are applied to the memory cell during the first programming pass, and the blanket programming pulses do not include verify operations; and performing, at the memory controller, a second programming pass after completion of the first programming pass to program the memory cell, wherein a defined number of program and verify (PV) pulses are applied to the memory cell during the second programming pass.

In one example of the method for programming a memory cell in a memory device, the method further comprises:
performing the first programming pass by applying the defined number of blanket programming pulses to transform a defined number of levels in the memory cell into a defined number of intermediate coarse levels in the memory cell; and
performing the second programming pass by applying the defined number of PV pulses to the defined number of intermediate coarse levels in the memory cell.

In one example of the method for programming a memory cell in a memory device, the method further comprises: performing a prologue programming pass prior to the first programming pass to achieve a stationary programming condition.

In one example of the method for programming a memory cell in a memory device, the method further comprises: performing a two-pass programming procedure that includes the first programming pass and the second programming pass, wherein the first programming pass excludes verify operations to reduce a programming time and the second programming pass includes verify operations.

In one example of the method for programming a memory cell in a memory device:
the first programming pass includes a defined number of incremental step pulse programming (ISPP) blanket programming pulses without the verify operations; and
the second programming pass includes a defined number of PV ISPP programming pulses.

In one example of the method for programming a memory cell in a memory device, the memory cell is a multi-bit cell.

In one example of the method for programming a memory cell in a memory device, the memory cell is quad-level cell (QLC) with 4 bits of data.

In one example of the method for programming a memory cell in a memory device, the memory device is a NAND flash memory device.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory device operable to program memory cells in the memory device, the memory device comprising:
a plurality of memory cells; and
a memory controller comprising logic to:
perform a prologue programming pass prior to a first programming pass to achieve a stationary programming condition for a memory cell in the plurality of memory cells and set an initial state for the first programming pulse, wherein the prologue programming pass includes applying a defined number of incremental program and verify (PV) pulses to the memory cell prior to the first programming pass;
perform the first programming pass to program the memory cell in the plurality of memory cells, wherein a defined number of blanket programming pulses are applied to the memory cell during the first programming pass, and the blanket programming pulses do not include verify operations; and
perform a second programming pass to program the memory cell, wherein a defined number of PV pulses are applied to the memory cell during the second programming pass.

2. The memory device of claim 1, wherein the memory controller comprises further logic to:
perform the first programming pass by applying the defined number of blanket programming pulses to transform a defined number of levels in the memory cell into a defined number of intermediate coarse levels in the memory cell; and
perform the second programming pass by applying the defined number of PV pulses to the defined number of intermediate coarse levels in the memory cell.

3. The memory device of claim 1, wherein:
the first programming pass includes a defined number of incremental step pulse programming (ISPP) blanket programming pulses without the verify operations; and
the second programming pass includes a defined number of PV ISPP programming pulses.

4. The memory device of claim 1, wherein the memory controller further comprises logic to perform a two-pass programming procedure that includes the first programming pass and the second programming pass, wherein the first programming pass excludes verify operations and the second programming pass includes verify operations.

5. The memory device of claim 1, wherein the memory controller further comprises logic to perform the first programming pass without the verify operations to reduce a programming time for programming the memory cell.

6. The memory device of claim 1, wherein the defined number of blanket programming pulses and the defined number of PV pulses depend on a number of bits in the memory cell.

7. The memory device of claim 1, wherein the plurality of memory cells are multi-bit cells.

8. The memory device of claim 1, wherein the plurality of memory cells are quad-level cells (QLC) with 4 bits per cell.

9. The memory device of claim 1, wherein the memory device is a NAND flash memory device.

10. A NAND flash memory device operable to program memory cellsin the NAND memory device, the NAND memory device comprising:
a plurality of memory cells; and
a memory controller comprising logic to:
perform a prologue programming pass prior to a first programming pass to achieve a stationary programming condition for a memory cell in the plurality of memory cells and set an initial state for the first programming pulse, wherein the prologue programming pass includes applying a defined number of incremental program and verify (PV) pulses to the memory cell prior to the first programming pass;
perform the first programming pass to program a defined number of levels in the memory cell in the plurality of memory cells, wherein a defined number of blanket programming pulses are applied to the defined number of levels in the memory cell during the first programming pass, and the blanket programming pulses do not include verify operations; and perform a second programming pass to program the defined number of levels in the memory cell after completion of the first programming pass, wherein a defined number of PV pulses are applied to the defined number of levels in the memory cell during the second programming pass.

11. The NAND flash memory device of claim 10, wherein the memory controller further comprises logic to:

perform the first programming pass in order to transform the defined number of levels in the memory cell into a defined number of intermediate coarse levels in the memory cell; and perform the second programming pass by applying the defined number of PV pulses to the defined number of intermediate coarse levels in the memory cell.

12. The NAND flash memory device of claim 10, wherein:

the first programming pass includes a defined number of incremental step pulse programming (ISPP) blanket programming pulses without the verify operations; and the second programming pass includes a defined number of PV ISPP programmingpulses.

13. The NAND flash memory device of claim 10, wherein the memory controller further comprises logic to perform a two-pass programming mechanism that includes the first programming pass and the second programming pass, wherein the first programming pass excludes verify operations and the second programming pass includes verify operations.

14. The NAND flash memory device of claim 10, wherein the memory controller further comprises logic to perform the first programming pass without the verify operations to reduce a programming time for programming the memory cell.

15. The NAND flash memory device of claim 10, wherein the defined number of levels in the memory cell depends on a number of bits in the memory cell, and the defined number of blanket programming pulses and the defined number of PV pulses correspond to the defined number of levels.

16. The NAND flash memory device of claim 10, wherein the plurality of memory cells are multi-bit cells.

17. The NAND flash memory device of claim 10, wherein the plurality of memory cells are quad-level cells (QLC) with 4 bits per cell.

18. A method for programming a memory cell in a memory device, comprising:

performing, at a memory controller in the memory device, a prologue programming pass prior to a first programming pass to achieve a stationary programming condition for the memory cell in the memory device and setting an initial state for the first programming pulse, wherein the prologue programming pass includes applying a defined number of incremental program and verify (PV) pulses to the memory cell prior to the first programming pass;

performing, at the memory controller, the first programming pass to program the memory cell in the memory device, wherein a defined number of blanket programming pulses are applied to the memory cell during the first programming pass, and the blanket programming pulses do not include verify operations; and performing, at the memory controller, a second programming pass after completion of the first programming pass to program the memory cell, wherein a defined number of PV pulses are applied to the memory cell during the second programming pass.

19. The method of claim 18, further comprising:

performing the first programming pass by applying the defined number of blanket programming pulses to transform a defined number of levels in the memory cell into a defined number of intermediate coarse levels in the memory cell; and performing the second programming pass by applying the defined number of PV pulses to the defined number of intermediate coarse levels in the memory cell.

20. The method of claim 18, further comprising performing a two-pass programming procedure that includes the first programming pass and the second programming pass, wherein the first programming pass excludes verify operations to reduce a programming time and the second programming pass includes verify operations.

21. The method of claim 18, wherein:

the first programming pass includes a defined number of incremental step pulse programming (ISPP) blanket programming pulses without the verify operations; and the second programming pass includes a defined number of PV ISPP programming pulses.

22. The method of claim 18, wherein the memory cell is a multi-bit cell.

23. The method of claim 18, wherein the memory cell is quad-level cell (QLC) with 4 bits of data.

24. The method of claim 18, wherein the memory device is a NAND flash memory device.

* * * * *